_United States Patent_ [19]

Ito

[11] Patent Number: 5,029,282
[45] Date of Patent: Jul. 2, 1991

[54] VOLTAGE REGULATOR CIRCUIT
[75] Inventor: Makoto Ito, Yokohama, Japan
[73] Assignee: Kabushiki Kaisha Toshiba, Kawasaki, Japan
[21] Appl. No.: 450,569
[22] Filed: Dec. 14, 1989
[30] Foreign Application Priority Data
 Feb. 16, 1989 [JP] Japan .................................. 1-36479
[51] Int. Cl.$^5$ .......................... H03L 1/00; H03K 3/354
[52] U.S. Cl. ................................ 307/296.8; 307/296.2
[58] Field of Search ............... 307/296.8, 296.7, 296.2, 307/296.1, 491, 494, 304

[56] References Cited
U.S. PATENT DOCUMENTS

| 4,439,692 | 3/1984 | Beekmans et al. | 307/304 |
| 4,553,047 | 11/1985 | Dillinger et al. | 307/296.8 |
| 4,631,421 | 12/1986 | Inoue et al. | 307/296.2 |
| 4,961,167 | 10/1990 | Kumanoya et al. | 307/296.2 |
| 4,964,082 | 10/1990 | Sato et al. | 307/296.2 |

FOREIGN PATENT DOCUMENTS

| 24903 | 3/1981 | European Pat. Off. . |
| 301184 | 2/1989 | European Pat. Off. . |
| 3704609 | 8/1987 | Fed. Rep. of Germany . |
| 3814667 | 11/1988 | Fed. Rep. of Germany . |

OTHER PUBLICATIONS

Pathak et al, "A 19-ns 250-MW CMOS Erasable Programmable Logic Device", IEEE Journal of Solid-State Circuits, vol. SC-21, No. 5, Oct. 1986, pp. 775-784.
Patent Abstracts of Japan, vol. 10, No. 347 [E-457] [2403] Oct. 21, 1986.
Oto et al, "High-Voltage Regulation and Process Considerations for High-Density 5V-Only E$^2$PROM's", IEEE Journal of Solid-State Circuits, vol. SC-18, No. 5, Oct. 1983, pp. 532-538.
McCreary et al, "Techniques for a 5-V-Only 64K EPROM Based Upon Substrate Hot-Electron Injection", IEEE Journal of Solid-State Circuits, vol. SC-19, No. 1, Feb. 1984, pp. 135-143.

Primary Examiner—Stanley D. Miller
Assistant Examiner—Richard Roseen
Attorney, Agent, or Firm—Finnegan, Henderson, Farabow, Garrett and Dunner

[57] ABSTRACT

A voltage regulator circuit for use with an integrated circuit with a charge pump circuit having a voltage output terminal and a voltage input terminal in which a plurality of voltage regulating P-channel MOS transistors, each of which has its source and substrate connected together and its gate and drain connected together, are connected in series between the voltage output and input terminals of the charge pump circuit.

8 Claims, 4 Drawing Sheets

F I G. 2
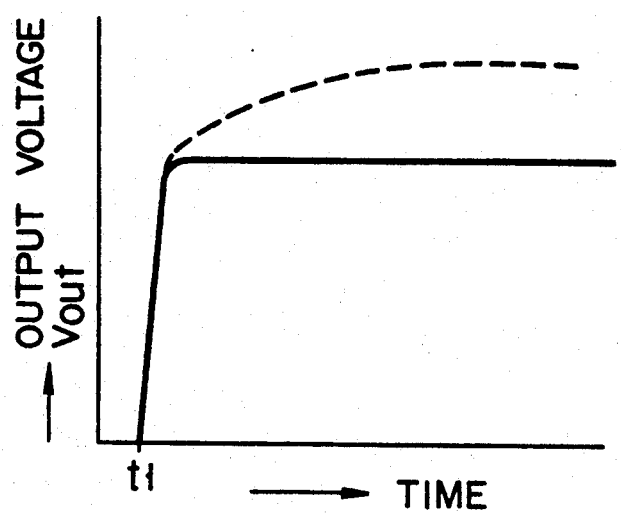
F I G. 3
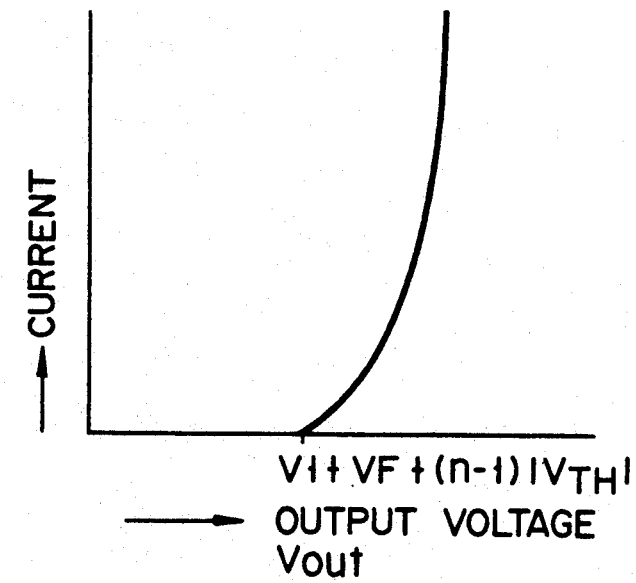
F I G. 4
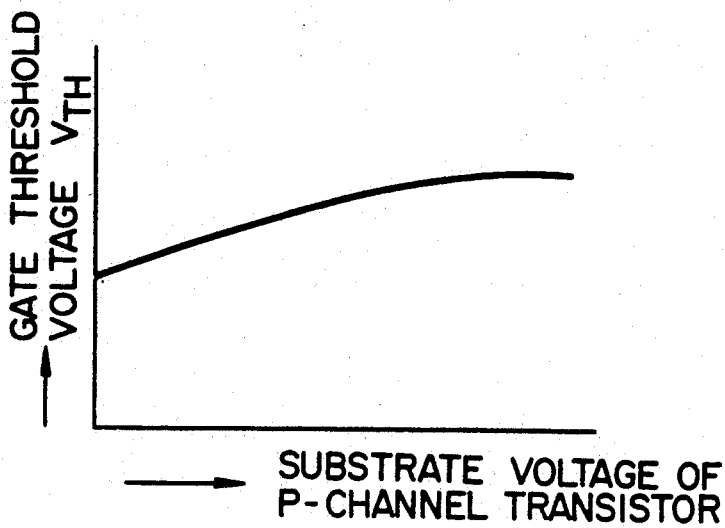

VOLTAGE REGULATOR CIRCUIT

BACKGROUND OF THE INVENTION

1. Field of the Invention

The present invention relates to a voltage regulator circuit for holding an output voltage of a charge pump circuit in a semiconductor integrated circuit substantially constant.

2. Description of the Related Art

Typical examples of voltage regulators adapted to hold output voltages of charge pump circuits in semiconductor integrated circuits substantially constant are described in the following articles (1)–(3).

(1) In the article entitled "High-Voltage Regulation and Process Considerations for High-Density 5 V-only E$^2$PROM,s" by DUANE H. OTO et al., IEEE Journal of Solid-State Circuits, Vol. SC-18, No. 5, Oct. 1983, pp 532–538, the output voltage of the charge pump circuit is compared with a reference voltage to control a clock signal for the charge pump circuit.

(2) In the article entitled "Techniques for a 5-V-Only 64K EPROM Based Upon Substrate Hot-Electron Injection" by JAMES L. McCGREARY et al., IEEE Journal of Solid-State Circuits, Vol. SC-19, No. 1, Feb. 1984, pp 135–143, the output voltage of the charge pump circuit is applied to a plurality of MOS transistors to produce a control voltage which, in turn, is applied to the gate of a MOS transistor connected between the output node of the charge pump circuit and the supply voltage node so as to cause it to conduct. The output voltage is clamped by the MOS transistor.

(3) In the article entitled "A 19-ns 250-mW CMOS Erasable Programmable Logic Device" by JAGDISH PATHAK, IEEE Journal of Solid-State Circuits, Vol. SC-21, No. 5, Oct. 1986, pp 775–784, two N-channel MOS transistors, each of which has its gate and drain connected together, are connected in series between the output node and input node of the charge pump circuit to produce an output voltage of Vpp+2 Vtn (Vpp stands for a input voltage and Vtn stands for the threshold voltage of an N-channel MOS transistor).

However, the voltage-regulating N-channel MOS transistors used in the third article have a wide variability of threshold voltage because of the effect of back-gate bias. Thus, for a desired voltage regulating property it is difficult to determine the number of N-channel transistors to be connected in series. In addition, in case where a high voltage is abruptly output from the charge pump circuit and applied across the drain-source path of the N-channel MOS transistor, the transistor may be short-circuited. In such case, the voltage-regulating property of the voltage regulator circuit would be deteriorated because of the N-channel MOS transistor. In the worst case, the voltage regulation would become impossible. An integrated circuit incorporating the voltage-regulating N-channel MOS transistors is thus low in reliability.

SUMMARY OF THE INVENTION

It is accordingly an object of the present invention to provide a voltage regulator circuit which solves the problem of low reliability of the voltage regulating property, which arises from difficulty in determining the number of N-channel MOS transistors used as voltage-regulating MOS transistors for obtaining a desired voltage-regulating property.

It is another object of the present invention to provide a voltage regulator circuit which solves the problem of deterioration of the voltage regulating property of MOS transistors when they are abruptly supplied with a high voltage from a charge pump circuit, which might cause incapability of the voltage regulation in the worst case, and which avoids the flow of unnecessary dc current through the MOS transistors when no input voltage is applied thereto from the charge pump circuit.

It is still another object of the present invention to provide a voltage regulator circuit which permits the avoidance of the flow of unnecessary dc current through voltage-regulating MOS transistors in case where a reference voltage becomes higher than an output voltage of the charge pump circuit at such a time when a test is made.

To attain the above objects, according to the present invention, a plurality of voltage-regulating P-channel MOS transistors, each of which has its source and substrate connected together and its gate and drain connected together, are connected in series between an voltage output terminal and an voltage input terminal of a charge pump circuit in a semiconductor integrated circuit. Such a P-channel MOS transistor having its source and substrate connected to together and its gate and drain connected together is not very subject to the effect of back-gate bias. It is therefore easy to determine the number of P-channel MOS transistors to be connected in series for a desired voltage regulating property, improving the reliability of voltage regulating property.

BRIEF DESCRIPTION OF THE DRAWINGS

FIG. 2 is a graph illustrating an exemplary voltage regulating property of the voltage regulator circuit of FIG. 1;

FIG. 3 is a graph illustrating an exemplary output voltage-current characteristic of the voltage regulator circuit of FIG. 1;

FIG. 4 is a graph illustrating the effect of back-gate bias of P-channel MOS transistors in the voltage regulator circuit of FIG. 1;

DETAILED DESCRIPTION OF THE PREFERRED EMBODIMENTS

Figure 1:
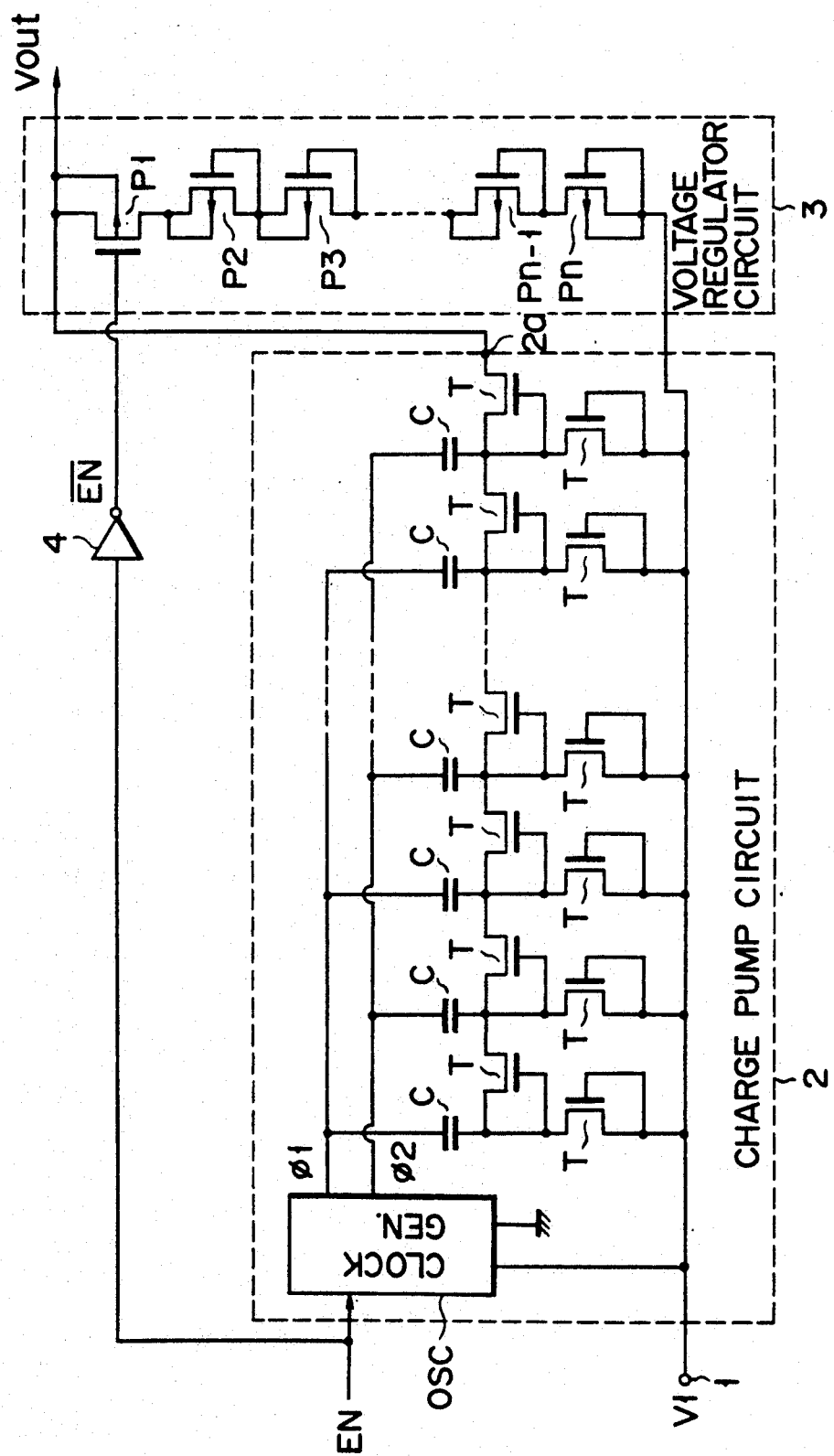
FIG. 1 is a circuit diagram of a voltage regulator circuit embodying the present invention.

Referring to a charge pump circuit-voltage regulator circuit formed in a semiconductor integrated circuit according to the present invention comprises a voltage input terminal 1 for receiving a input voltage V1, a charge pump circuit 2 for producing a high output voltage Vout from the input voltage V1 at input terminal 1, a voltage regulator circuit 3 for regulating the output voltage Vout of charge pump circuit 2 to a substantially constant level and an inverter 4 for inverting an enable signal EN to apply an inverted enable signal $\overline{\text{EN}}$ to voltage regulator circuit 3.

Charge pump circuit 2 comprises a clock generator OSC for producing nonoverlapping two-phase clock signals $\phi1$ and $\phi2$ when the enable signal EN is active (at a "High" level), boosting capacitors C each of which receives at one end the clock signal φ1 or φ2 and MOS transistors T connected to the other end of each of capacitors C, thereby to produce output voltage Vout boosted relative to input voltage V1.

In voltage regulator circuit 3, a plurality of P-channel enhancement MOS transistors P2-P(n−1), each of which has its source and substrate connected together and its gate and drain connected together, are connected in series between voltage output terminal 2a and voltage input terminal 1 of charge pump circuit 2. In addition, the source-drain path of a P-channel MOS transistor P1 with its source and substrate connected together and its gate supplied with inverted signal $\overline{EN}$ of enable signal EN is connected between voltage output terminal 2a of charge pump circuit 2 and one end of the series connection of P-channel MOS transistors P2 to P(n−1) (namely, the connection point of the source and substrate of P-channel MOS transistor P2). Moreover, between the other end of the series connection of P-channel MOS transistors P2 to P(n−1) (namely, the connection point of the gate and drain of P-channel MOS transistor P(n−1)) and voltage input terminal 1 is connected a P-channel MOS transistor Pn having its gate, drain and substrate connected together. The MOS transistor Pn may be replaced with a diode.

Next, the operation of voltage regulator 3 will be described with reference to FIGS. 2 and 3 which illustrate the voltage regulating property and the voltage vs. current characteristic, respectively.

When the enable signal EN is inactive (at a "Low" level) and thus inverted signal $\overline{EN}$ is at a "H" level, charge pump circuit 2 is disabled, and P-channel MOS transistor P1 is in the off state so that voltage regulator circuit 3 is disabled. When enable signal EN is rendered active (goes to a "H" level) at a time t1, charge pump circuit 2 is enabled and P-channel MOS transistor P1 is rendered on. Consequently the output voltage of charge pump circuit 2 rises and increases gradually as indicated in dotted line in FIG. 2, but output voltage Vout is regulated to a substantially constant level by means of voltage regulator circuit 3. It is to be noted here that the output voltage Vout is given by $$Vout = V1 + VF + (n-1)|Vth|$$

where VF stands for the forward voltage of the PN junction diode of P-channel MOS transistor Pn and Vth stands for the threshold voltage of each of P-channel MOS transistors P1 to P(N−1).

According to voltage regulator circuit 3 described above, as voltage regulating MOS transistors are used P-channel transistors P2 to P(n−1) each of which has its source and substrate connected together and its gate and drain connected together. P-channel transistors P2 to P(n−1) suffers such an effect of back-gate bias as shown in FIG. 4, which is not very serious. It is therefore easy to determine the number of P-channel MOS transistors for obtaining a desired voltage regulating property. The reliability of the voltage regulating property thus increases.

Even if a high voltage is abruptly applied to the source of P-channel MOS transistor P1 from charge pump circuit 2 when enable signal EN is rendered active ("H" level), transistor P1 is turned on by inverted signal $\overline{EN}$ applied to its gate at the same time charge pump circuit 2 starts operating. Thus, the reliability of P-channel MOS transistor P1 will not be degraded. The problems of degradation of the voltage regulating property and incapability of voltage regulation will not arise.

The reliability of an integrated circuit incorporating voltage regulator 3 will not be degraded.

Moreover, when a boosted voltage is not applied to voltage regulator circuit 3 from charge pump circuit 2, that is, when the enable signal EN is inactive (at a "L" level), no dc current will flow through voltage regulator circuit 3 and thus unnecessary current dissipation is not produced because P-channel MOS transistor P1 is turned off by the inverted enable signal $\overline{EN}$.

Also, with such a voltage regulator 3 as described above, even when the potential at voltage input terminal 1 becomes higher than that at voltage output terminal 2a at a time of testing, for example, unnecessary dc current flow in the opposite direction from voltage input terminal 1 to voltage output terminal 2a will be avoided because of the existence of the PN junction diode of P-channel MOS transistor Pn.

Figure 5:
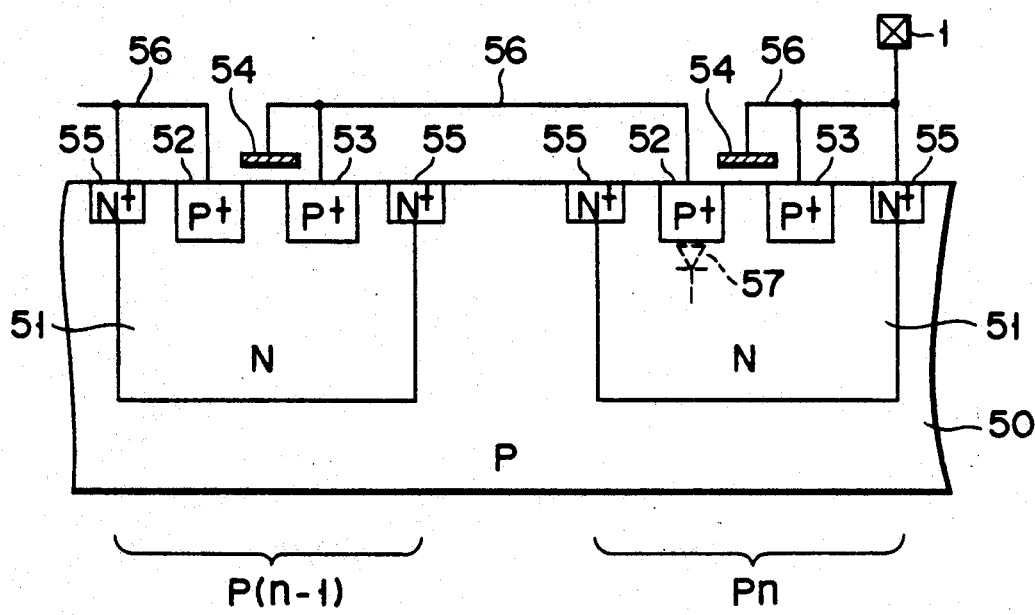
FIG. 5 is a sectional view of part of P-channel MOS transistors in the voltage regulator circuit of FIG. 1.

FIG. 5 illustrates a sectional structure of P-channel MOS transistors Pn and P(n−1) which constitute part of voltage regulator circuit 3. That is, reference numeral 50 denotes a P-type semiconductor substrate, 51 an N well, 52 a P+ impurity region for the source, 53 a P+ type impurity region for the drain, 54 a gate electrode, 55 an N+ type well electrode and 56 wiring. As can be seen from the figure, because a PN junction diode 57 is formed between the source and the substrate in P-channel MOS transistor Pn which has its substrate (N well), gate and drain connected together, reverse current flow from voltage input terminal 1 can be avoided.

It is to be noted that, if P-channel MOS transistor P1 is omitted in the above embodiment, the effect of improved reliability of the voltage-regulating property from the existence of P-channel MOS transistors P2-P(n−1) and the effect resulting from the existence of P-channel MOS transistor Pn will be obtained.

Figure 6:
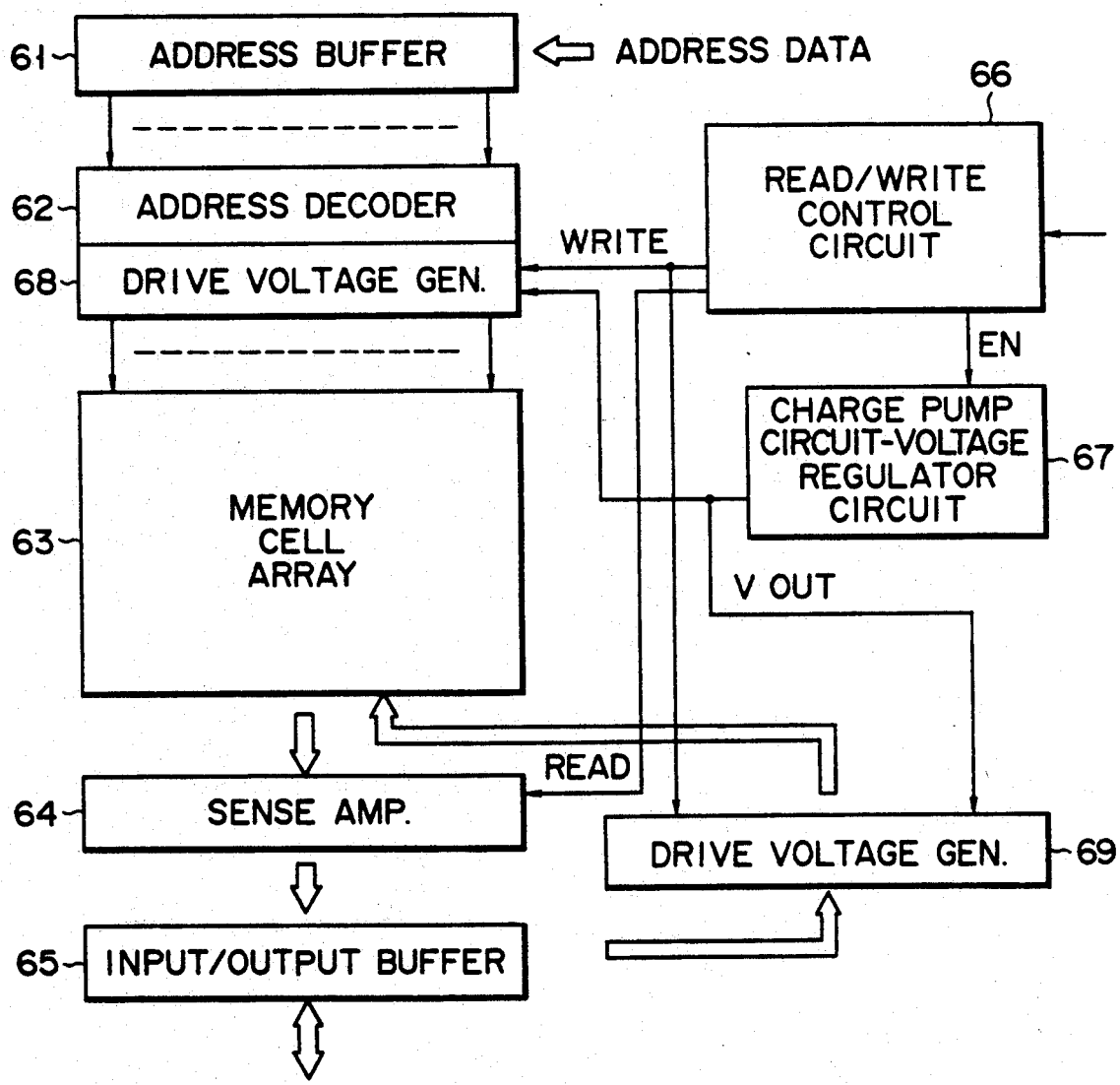
FIG. 6 is a block diagram of a nonvolatile memory integrated circuit in which the present invention finds application.

FIG. 6 is a block diagram of a nonvolatile memory integrated circuit, for example, an EPROM integrated circuit, to which the present invention is applied.

In the EPROM integrated circuit, reference numeral 61 denotes an address buffer to which address data is applied, 62 an address decoder, 63 a memory cell array, 64 a sense amplifier, 65 an input/output buffer, 66 a read/write control circuit, 67 such a charge pump circuit-voltage regulator circuit as shown in FIG. 1, 68 a row drive voltage generator, and 69 a column drive voltage generator. Sense amplifier 64 is enabled by a read control signal READ from read/write control circuit 66. When supplied with the enable signal EN from read/write control circuit 66, charge pump circuit-voltage regulator circuit 67 produces a boosted voltage Vout regulated to a substantially constant level. Row drive voltage generator 68 applies the boosted voltage Vout from charge pump circuit-voltage regulator circuit 67 to a selected word line of memory cell array 63 in a write mode in which the generator 68 receives a write control signal WRITE from read/write control circuit 66. In the write mode, column drive voltage generator 69 is responsive to the write control signal WRITE from read/write control circuit 66 to apply the boosted voltage Vout from charge pump circuit-voltage regulator circuit 67 to a selected column line of memory cell array 63 according to input data from input/output buffer 65.

In the above EPROM integrated circuit, the high boosted voltage Vout is applied to the gate and drain of a memory cell connected to the selected word line and column line of memory cell array 63 so that input data is written into the selected memory cell.

It is to be noted that the voltage regulator circuit of the present invention may be applied to E²PROM integrated circuits and logic integrated circuits incorporating nonvolatile memory cells.

Although only one embodiment of the invention has been disclosed and described, it is apparent that other embodiments and modifications of the invention are possible.

What is claimed is:

1. A voltage regulator circuit for use with a semiconductor integrated circuit having a charge pump circuit with a voltage output terminal and a voltage input terminal, including a plurality of P-channel MOS transistors connected in series between said voltage output terminal and said voltage input terminal of said charge pump circuit, each of said P-channel MOS transistors having its source and substrate connected together and its gate and drain connected together.

2. A voltage regulator circuit according to claim 1, in which between one end of the series connection of said P-channel MOS transistors and said voltage output terminal of said charge pump circuit is connected a P-channel MOS transistor which has its source and substrate connected together and is supplied at its gate with an enable signal synchronized with an enable signal for said charge pump circuit.

3. A voltage regulator circuit according to claim 1, in which between the other end of the series connection of said P-channel MOS transistors and said voltage input terminal of said charge pump circuit is connected a P-channel MOS transistor having its substrate, gate and drain connected together or a diode.

4. A voltage regulator circuit according to claim 2, in which a P-channel MOS transistor having its substrate, gate and drain connected together or a diode is connected between the other end of the series connection of said P-channel MOS transistors and said voltage input terminal of said charge pump circuit.

5. A voltage regulator circuit according to claim 1, in which said voltage regulator circuit regulates a boosted voltage to be applied to memory cells of a nonvolatile memory integrated circuit.

6. A voltage regulator circuit according to claim 2, in which said voltage regulator circuit regulates a boosted voltage to be applied to memory cells of a nonvolatile memory integrated circuit.

7. A voltage regulator circuit according to claim 3, in which said voltage regulator circuit regulates a boosted voltage to be applied to memory cells of a nonvolatile memory integrated circuit.

8. A voltage regulator circuit according to claim 4, in which said voltage regulator circuit regulates a boosted voltage to be applied to memory cells of a nonvolatile memory integrated circuit.

* * * * *